US009158876B2

(12) United States Patent
Apostol et al.

(10) Patent No.: US 9,158,876 B2
(45) Date of Patent: Oct. 13, 2015

(54) OPTIMIZING LITHOGRAPHY MASKS FOR VLSI CHIP DESIGN

(71) Applicant: International Business Machines Corporation, Armonk, NY (US)

(72) Inventors: Stefan Apostol, Lausanne (CH); Paul Hurley, Oberrieden (CH); Radu-Christian Ionescu, Lausanne (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/091,102

(22) Filed: Nov. 26, 2013

(65) Prior Publication Data

US 2015/0149971 A1    May 28, 2015

(51) Int. Cl.
    *G06F 17/50*    (2006.01)
(52) U.S. Cl.
    CPC .................. *G06F 17/5068* (2013.01)
(58) Field of Classification Search
    CPC ................. G06F 17/30; G06F 17/50
    USPC .......................................... 716/55
    See application file for complete search history.

(56) References Cited

U.S. PATENT DOCUMENTS

| 7,343,582 B2 | 3/2008 | Mukherjee et al. | |
| 7,568,179 B1 | 7/2009 | Kroyan et al. | |
| 7,703,049 B2* | 4/2010 | Abrams et al. | 716/50 |
| 8,069,423 B2 | 11/2011 | Ghan et al. | |
| 2007/0186206 A1* | 8/2007 | Abrams et al. | 716/19 |
| 2010/0039633 A1 | 2/2010 | Granik | |
| 2010/0162197 A1* | 6/2010 | Ye et al. | 716/21 |
| 2011/0145769 A1* | 6/2011 | Wei | 716/56 |
| 2011/0173579 A1 | 7/2011 | Mukherjee | |
| 2011/0271240 A1* | 11/2011 | Hurley et al. | 716/55 |
| 2012/0272195 A1 | 10/2012 | Hsuan et al. | |
| 2013/0198699 A1 | 8/2013 | Simmons | |
| 2013/0290915 A1* | 10/2013 | Wei | 716/56 |
| 2014/0143740 A1 | 5/2014 | Droz et al. | |

OTHER PUBLICATIONS

Shiyuan Liu et al., "Fast Aerial Image Simulation Using One Basis Mask Pattern for Optical Proximity Correction," Journal of Vacuum Science & Technology B: Microelectronics and Nanometer Structures (vol. 29, Issue: 6), Nov. 2011, 8 pgs.
A. Poonawala wt al., "Mask Design for Optical Microlithography—An Inverse Imaging Problem," IEEE Transactions on Image Processing, (vol. 16, Issue: 3), Mar. 2007, 15 pgs.
Jue-Chin Yu et al., "Gradient-Based Fast Source Mask Optimization (SMO)," SPIE 7973, Optical Microlithography XXIV, 797320 (Mar. 22, 2011); doi: 10.117/12.879441, 13 pgs.

(Continued)

*Primary Examiner* — Mohammed Alam
(74) *Attorney, Agent, or Firm* — Cantor Colburn LLP; Daniel Morris

(57) ABSTRACT

In one embodiment, a computer-implemented method includes accessing mask input data. The mask input data includes a mathematical representation of a mask in a mask representation space, where the mask is configured to create an integrated circuit microprocessor. A set of values is obtained based on a derivative of the mask input data. The set of values is optimized, by a computer processor, in a derivative domain to obtain optimized mask data. The optimized mask data is transformed into the mask representation space to obtain printable mask output data.

20 Claims, 5 Drawing Sheets

(56) References Cited

OTHER PUBLICATIONS

Amyn Poonawala and Peyman Milanfar. Mask design for optical microlithographyan inverse imaging problem. Image Processing, IEEE Transactions on, 16(3):774-788, 2007.

Amyn Poonawala, Peyman Milanfar, and DG Flagello. Opc and psm design using inverse lithography: A non-linear optimization approach. In Proc. SPIE, vol. 6154, pp. 61543H1-615431114, 2006.

Edmund Y Lam and Alfred K Wong. Computation lithography: virtual reality and virtual virtuality. Opt. Express, 17(15):12259-12268, 2009.

Joydeep Mitra, Peng Yu, and David Z Pan. Radar: Ret-aware detailed routing using fast lithography simulations. In Design Automation Conference, 2005. Proceedings. 42nd, pp. 369-372. IEEE, 2005.

Peng Yu. Fast and accurate lithography simulation and optical proximity correction for nanometer design for manufacturing. PhD Dissertation, 2009. 200 pgs.

Rajai Nasser and Paul Hurley. On the accuracy of different fourier transforms of vlsi designs. In SPIE Advanced Lithography, pp. 868319-868319. International Society for Optics and Photonics, 2013.

Yong Liu, Dan Abrams, Linyong Pang, and Andrew Moore. Inverse lithography technology principles in practice: Unintuitive patterns. In Photomask Technology 2005, pp. 599231-599231. International Society for Optics and Photonics, 2005.

HH Hopkins. The concept of partial coherence in optics. Proceedings of the Royal Society of London. Series A. Mathematical and Physical Sciences, 208(1093):263-277, 1951.

Nicolas B Cobb and Avideh Zakhor. Fast sparse aerial-image calculation for opc. In 15th Annual Bacus Symposium on Photomask Technology and Management'95, pp. 534-545. International Society for Optics and Photonics, 1995.

* cited by examiner

OPTIMIZING LITHOGRAPHY MASKS FOR VLSI CHIP DESIGN

BACKGROUND

Various embodiments of this disclosure relate to very-large-scale integration (VLSI) chip design and, more particularly, to outputting masks that print closely to desired layout patterns for chip designs.

VLSI chip design is a multi-billion dollar business. With technology node sizes shrinking to as low as fourteen nanometers, it can be difficult to get sufficient yield from an optical lithographic process.

Computational methods are often used to modify an input mask, which represents a desired circuit. A widely adopted technique for improving printability is inverse lithography, which consists of modifying the mask of a chip design by adding features to precompensate for expected distortion during imaging. Another technique is the creation of a Phase-Shifting Mask (PSM). This technique provides an additional degree of freedom, in the phase of the mask element.

An improved method for mask design has been proposed in the past, involving decomposing a polygonal representation of the desired mask into a set of edges and corners. The edges and corners are moved and nudged until the output pattern resulting from application of the mask meets certain criteria. This method has the drawback that changes are made locally to edges and corners and, as a result, an extra verification step is required to check for transfer of unwanted side-lobs in the resulting pattern.

Another proposed solution is Variational Edge Placement Error, an improvement of the original Edge Placement Error used by mask synthesis and inverse lithography tools to compute displacement of segments, i.e., small parts of the polygonal edges of the mask. A vertex-based table-lookup is used to compute an aerial image of the mask, by first decomposing the rectilinear polygons into a summation of rectangles, and then using the precomputed values of the rectangle imprints. These and similar shape decomposition techniques rely on large tables of precomputed values and generally allow only for edge movement, making it impossible to analytically determine sub-resolution assist feature (SRAF) placement.

Sampling both the mask and a filter (i.e., an aerial image) on a rectangular grid allows for implementation of discrete methods to solve the inverse lithography problem. It has been proven that adapted sampling is needed to avoid aliasing, which is inherent by the discontinuous nature of the rectilinear polygons, otherwise having an over- or underestimate of the Critical Dimension. It has also been demonstrated that approximating a continuous time convolution by a discrete convolution can be counteracted by sampling at least twice the Nyquist rate of the filter. Filtering is performed in the frequency domain by the use of Fast Fourier (FFT) transforms. These methods have a computational time that does not scale with the content of the input (which is the polygons' shape and number), and that time increases with the sampling frequency.

Use of FFT transforms assumes that the mask and the filter are periodic in space, which is often not the case. Thus, all methods based on discretization will be limited by these assumptions, and any compensation for the assumptions (e.g., oversampling) will not scale well in time. Avoiding the discretization can be performed by separating the polygons in a sum of geometric figures, edges, or vertices, but no fast methods have been proposed that take advantage of the precision offered.

In recent years, "pixelated" masks (i.e., sampled masks) have been widely discussed, as they offer flexibility in mask design. The problem has been reduced to an unconstrained, continuous function optimization, which has been solved by a steepest descent algorithm. While the possibility to independently set any pixel in the aerial image improves printability greatly, the resulting complexity of the mask makes it impossible to fulfill manufacturing constraints. In an attempt to lower complexity of the mask, a regularization framework is employed with complexity penalty terms. The complexity still remains high, but this correction introduces further errors in the printed mask pattern. This technique allows integration of sensitive concepts, such as partially coherent illumination, mechanical fluctuations of the optical imaging system, algorithm variability, focus variation, and thin-mask assumptions. While providing a fast method to obtain the discrete mask, the technique is still based on sampling, and therefore all results are affected by aliasing. Furthermore, the output of the algorithm consists of floating point values, which then have to be thresholded to create the mask. The entire algorithm depends on this nonlinear operation to obtain a manufacturable mask, but there exists no proof that the obtained mask is optimal, regardless of whether the corresponding floating point valued image was optimal.

Accordingly, previous methods for performing inverse lithography are either fast and imprecise, and thereby incompatible with mask design rules, or they are slow, impractical, or inflexible.

SUMMARY

In one embodiment of this disclosure, a computer-implemented method includes accessing mask input data. The mask input data includes a mathematical representation of a mask in a mask representation space, where the mask is configured to create an integrated circuit microprocessor. A set of values is obtained based on a derivative of the mask input data. The set of values is optimized, by a computer processor, in a derivative domain to obtain optimized mask data. The optimized mask data is transformed into the mask representation space to obtain printable mask output data.

In another embodiment, a system includes a data receiver, a derivative unit, an optimizing unit, and a data output unit. Each of the data receiver, the derivative unit, the optimizing unit, and the data output unit may include hardware, software, or a combination thereof. The data receiver may be configured to access mask input data. The mask input data includes a mathematical representation of a mask in a mask representation space, where the mask is configured to create an integrated circuit microprocessor. The derivative unit is configured to obtain a set of values based on a derivative of the mask input data. The optimizing unit is configured to optimize the set of values in a derivative domain to obtain optimized mask data. The data output unit is configured to transform the optimized mask data into the mask representation space to obtain printable mask output data.

In yet another embodiment, a computer program product includes a computer readable storage medium having computer readable program code embodied thereon. The computer readable program code is executable by a processor to perform a method. The method includes accessing mask input data. The mask input data includes a mathematical representation of a mask in a mask representation space, where the mask is configured to create an integrated circuit microprocessor. Further according to the method, a set of values is obtained based on a derivative of the mask input data. The set of values is optimized, by a computer processor, in a derivative domain to obtain optimized mask data. The optimized mask data is transformed into the mask representation space to obtain printable mask output data.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Using a novel inverse lithographic technique, embodiments of an optimization system of this disclosure may overcome many of the limitations of conventional inverse lithographic techniques. The optimization system may be fast at generating masks, thus enabling more of a chip's design layout to be analyzed and altered, reducing time-to-production substantially, and thereby saving a substantial amount of money for each chip design. Masks produced by the optimization system may be accurate as compared to those produced by conventional techniques, and have been demonstrated to be manufacturable through reasonable means. Additionally, the resulting masks may be described by rectilinear polygons, and thus are the acceptable input for semiconductor fabrication plants.

Figure 1:
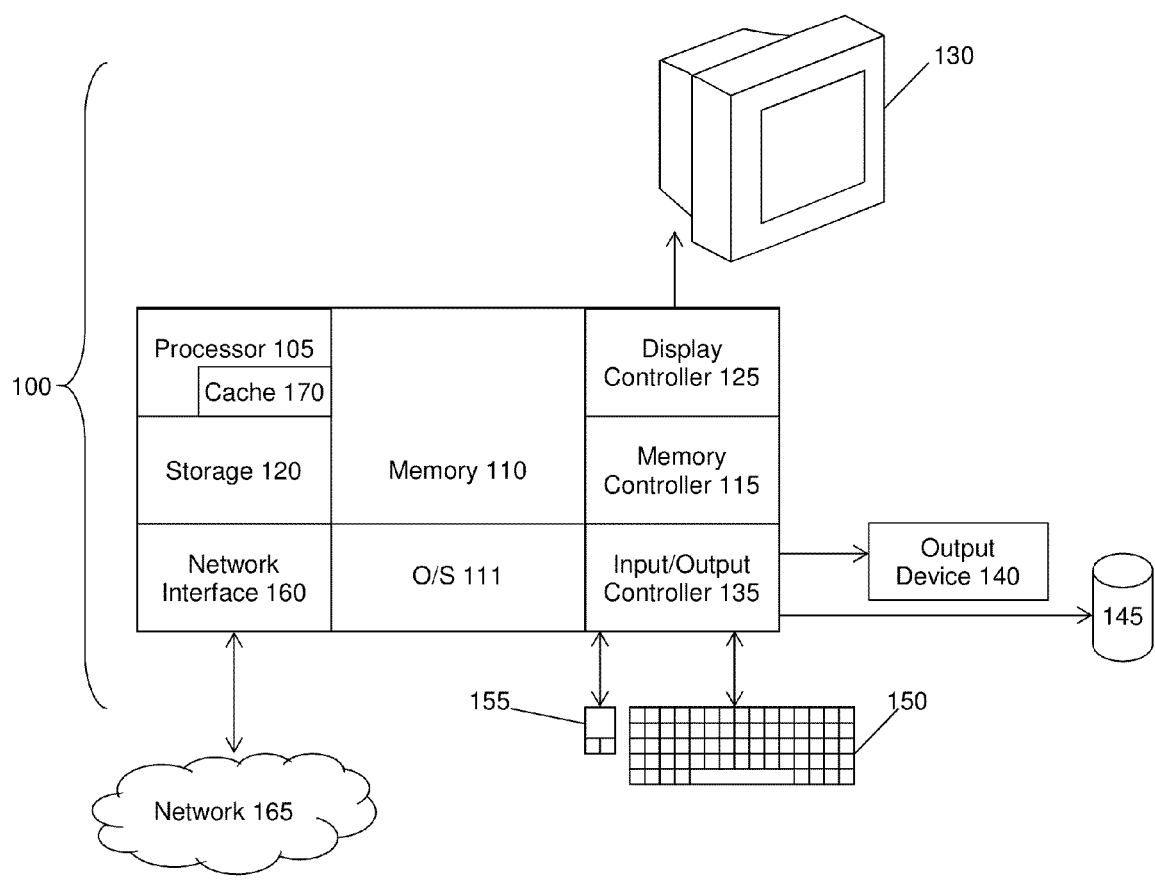
FIG. 1 is a block diagram of an exemplary computer system for implementing some or all aspects of the optimization system, according to some embodiments of this disclosure.

FIG. 1 illustrates a block diagram of a computer system 100 for use in implementing an optimization system or method according to some embodiments. The optimization systems and methods described herein may be implemented in hardware, software (e.g., firmware), or a combination thereof. In an exemplary embodiment, the methods described may be implemented, at least in part, in hardware and may be part of the microprocessor of a special or general-purpose computer system 100, such as a personal computer, workstation, minicomputer, or mainframe computer.

In an exemplary embodiment, as shown in FIG. 1, the computer system 100 includes a processor 105, memory 110 coupled to a memory controller 115, and one or more input devices 145 and/or output devices 140, such as peripherals, that are communicatively coupled via a local I/O controller 135. These devices 140 and 145 may include, for example, a printer, a scanner, a microphone, and the like. A conventional keyboard 150 and mouse 155 may be coupled to the I/O controller 135. The I/O controller 135 may be, for example, one or more buses or other wired or wireless connections, as are known in the art. The I/O controller 135 may have additional elements, which are omitted for simplicity, such as controllers, buffers (caches), drivers, repeaters, and receivers, to enable communications.

The I/O devices 140, 145 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 105 is a hardware device for executing hardware instructions or software, particularly those stored in memory 110. The processor 105 may be any custom made or commercially available processor, a central processing unit (CPU), an auxiliary processor among several processors associated with the computer system 100, a semiconductor based microprocessor (in the form of a microchip or chip set), a macroprocessor, or other device for executing instructions. The processor 105 includes a cache 170, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 170 may be organized as a hierarchy of more cache levels (L1, L2, etc.).

The memory 110 may include any one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, or other types of storage media. Note that the memory 110 may have a distributed architecture, where various components are situated remote from one another but may be accessed by the processor 105.

The instructions in memory 110 may include one or more separate programs, each of which comprises an ordered listing of executable instructions for implementing logical functions. In the example of FIG. 1, the instructions in the memory 110 include a suitable operating system (OS) 111. The operating system 111 essentially may control the execution of other computer programs and provides scheduling, input-output control, file and data management, memory management, and communication control and related services.

Additional data, including, for example, instructions for the processor 105 or other retrievable information, may be stored in storage 120, which may be a storage device such as a hard disk drive or solid state drive. The stored instructions in memory 110 or in storage 120 may include those enabling the processor to execute one or more aspects of the optimization systems and methods of this disclosure.

The computer system 100 may further include a display controller 125 coupled to a display 130. In an exemplary embodiment, the computer system 100 may further include a network interface 160 for coupling to a network 165. The network 165 may be an IP-based network for communication between the computer system 100 and any external server, client and the like via a broadband connection. The network 165 transmits and receives data between the computer system 100 and external systems. In an exemplary embodiment, the network 165 may be a managed IP network administered by a service provider. The network 165 may be implemented in a wireless fashion, e.g., using wireless protocols and technologies, such as WiFi, WiMax, etc. The network 165 may also be a packet-switched network such as a local area network, wide area network, metropolitan area network, the Internet, or other similar type of network environment. The network 165 may be a fixed wireless network, a wireless local area network (LAN), a wireless wide area network (WAN) a personal area network (PAN), a virtual private network (VPN), intranet or other suitable network system and may include equipment for receiving and transmitting signals.

Optimization systems and methods according to this disclosure may be embodied, in whole or in part, in computer program products or in computer systems 100, such as that illustrated in FIG. 1. More specifically, such a computer system 100 may be used to produce data representing masks according to this disclosure.

Figure 2:
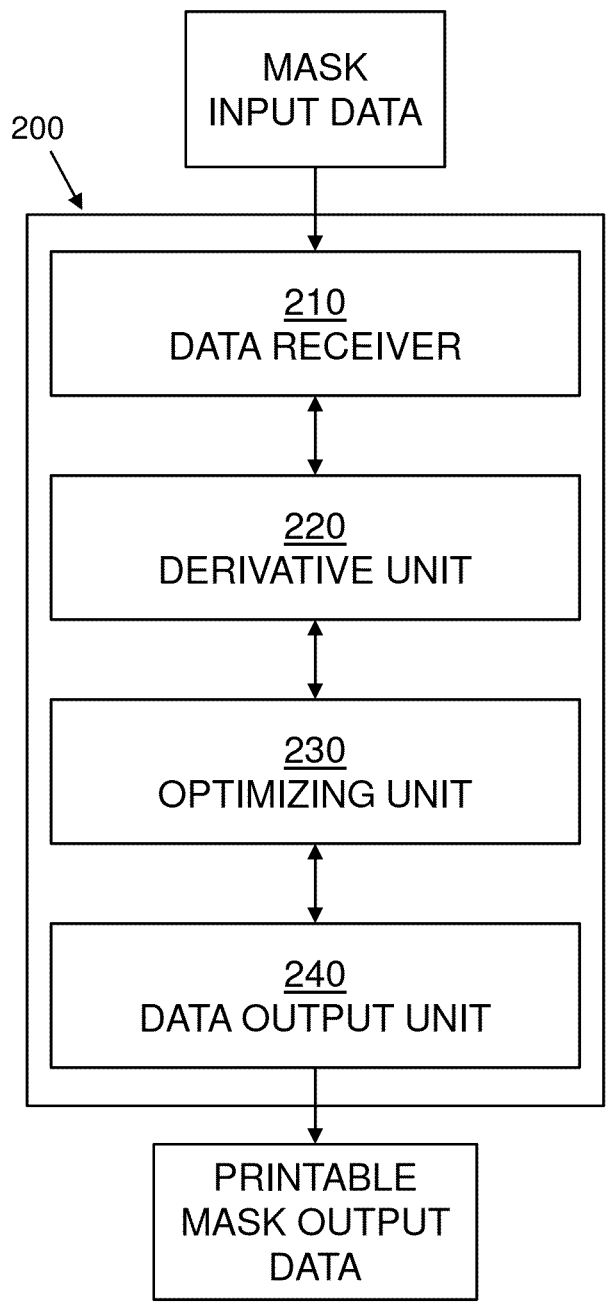
FIG. 2 is a block diagram of an optimization system, according to some embodiments of this disclosure.

FIG. 2 is a block diagram of an optimization system 200, according to some embodiments of this disclosure. As shown, the optimization system 200 may include a data receiver 210, a derivative unit 220, an optimizing unit 230, and a data output unit 240. The data receiver 210 may access mask input data, which may include a mathematical representation of a mask in a mask representation space. The mask may be designed to create an integrated circuit microprocessor. The derivative unit 220 may obtain a set of values based on a derivative of the mask input data. The optimizing unit 230 may optimize the set of values in a derivative domain to obtain optimized mask data. Finally, the data output unit 240 may transform the optimized mask data into the mask representation space to obtain printable mask output data. Each of the data receiver 210, the derivative unit 220, the optimizing unit 230, and the data output unit 240 may include hardware, software, or a combination thereof. Although these components are depicted as being distinct herein, it will be understood that this distinction is made for illustrative purposes only, and that the hardware or software used to implement these components may overlap or be further divided as needed.

The optimization system 200 may output a representation of a desired mask for a desired chip design. To this end, the optimization system 200 may use three closely related techniques, each based on the derivative of the desired mask, as opposed to the mask itself. The derivative of the mask is a discrete signal and may represent an accurate polygonal description of the mask. The sparseness of this signal may allow for fast computations of an aerial image derivative and may also offer precise results.

The optimization system 200 may additionally use concepts of cross-correlation, directional derivatives, convex optimization, and sigmoid functions. Cross-correlation is commonly used for searching a long-signal for a shorter, known feature, and is generally employed to analyze one-dimensional signals. According to this disclosure, however, cross-correlation is extended to two dimensions. Directional derivatives measure the variation of a function along the direction of a vector. This concept is often used when it is not desirable to set the Cartesian vectors, which would correspond to taking only a partial derivative. Embodiments of the optimization system 200 may use convex optimization to iteratively obtain a solution having low or minimal error. Additionally, the optimization system 200 may use the sigmoid function for resist etching modeling.

Some embodiments of the optimization system 200 use filtering with an integral of an aerial image (i.e., the filter), which may move the problem to a new domain with the use of a one-to-one transform. As a result, optimization can be performed in the mask derivative domain. The result of such optimization can be transformed back into a regular mask, producing the desired mask, without affecting associated estimates made during the optimization. The power of the transform may result from the fact that the transform may be sublinear, with a complexity lower than linear (i.e., O(N)). Although the mask derivative space is highly constrained, the optimization system 200 may use an efficient, convex algorithm to perform the optimization. It will be understood that the terms "optimization" and "optimize" as used herein need not refer to the best possible solution, but may instead refer to a solution that is deemed to be best based on established parameters and the operations performed according to this disclosure.

For example, assume a piecewise constant mask of [0,1] with the boundaries of each region being on a rectangular grid. This continuous mask can be represented by an array with the values of the region, without assuming discrete time sampling. The derivative along the axis of the grid in the x- and y-directions yields a [−1,1,2,−2] discrete time signal. The optimization system 200 may store this time signal in computer memory to represent the desired mask.

Figure 3A:
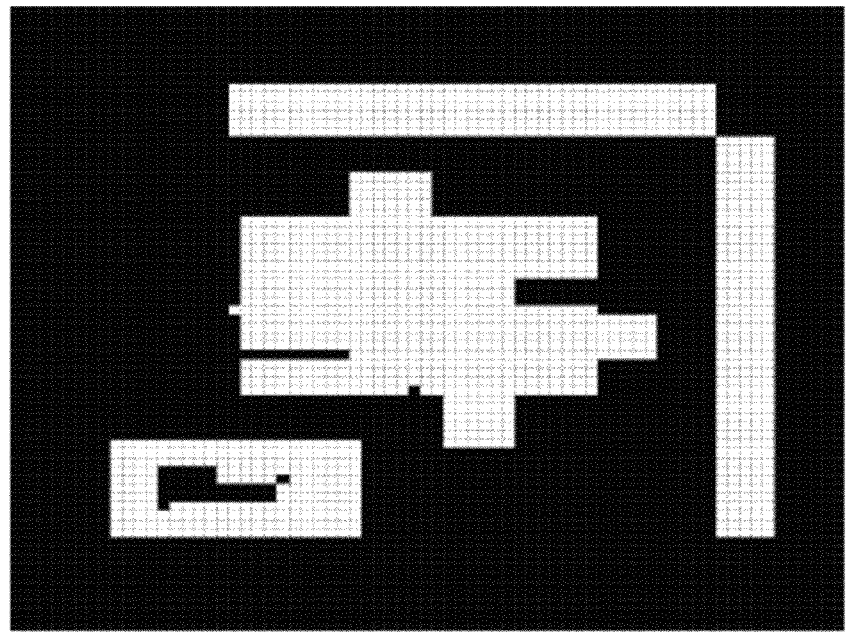
FIG. 3A illustrates an example piecewise constant mask on a rectangular grid, according to some embodiments of this disclosure.
Figure 3B:
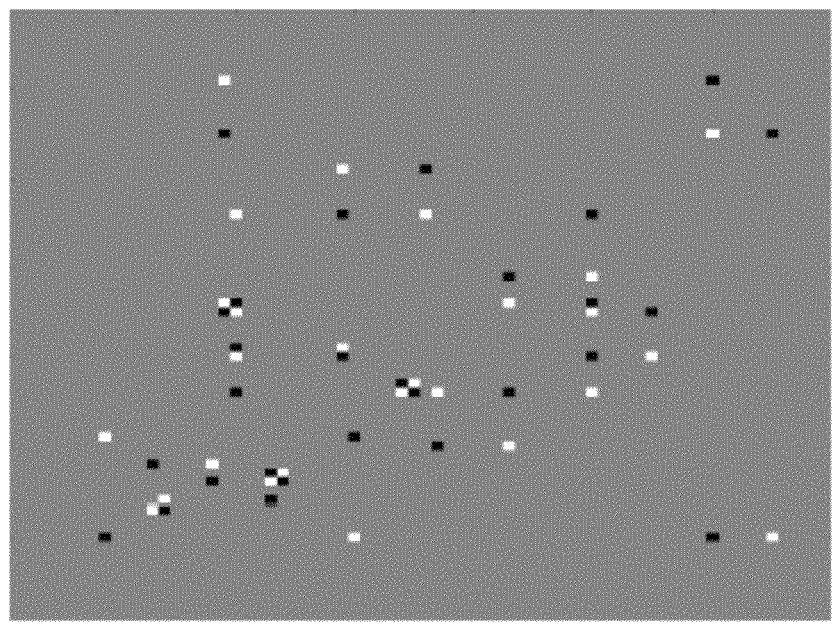
FIG. 3B illustrates a derivative of the mask shown in FIG. 3A, according to some embodiments of this disclosure.

For example, FIG. 3A illustrates a piecewise constant mask on the rectangular grid, and the mask's derivative is shown in FIG. 3B, according to some embodiments of this disclosure. The time domain convolution of the mask with a filter is equivalent to the discrete convolution between the derivative of the mask and the integral of the filter. The latter is a discrete convolution and may be implemented without loss of precision.

Figure 4:
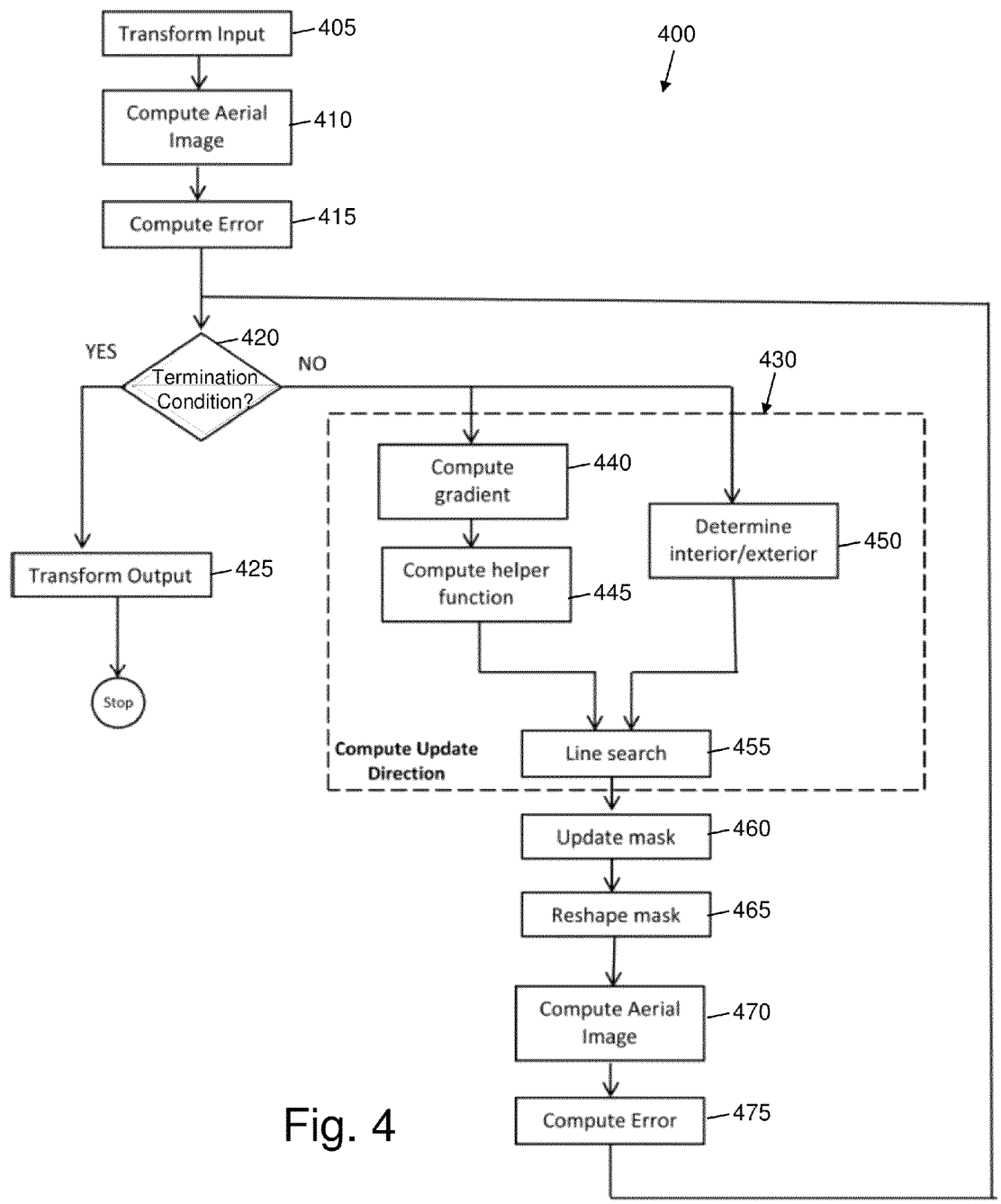
FIG. 4 is a flow diagram of a method for optimizing a mask, according to some embodiments of this disclosure.

FIG. 4 is a flow diagram of a method 400 for optimizing a mask, according to some embodiments of this disclosure. The optimization system 200 may take as input a layer, or part of a layer, of a VLSI layout (i.e., the desired pattern) and a photolithographic mask (i.e., the initial mask). After processing is complete, the optimization system 200 may output a resulting photolithographic mask (i.e., the desired mask). When the resulting mask is then used as input to a lithographic imprint system, the output pattern is close to the desired pattern.

At block 405, the optimization system 200 may receive and transform its input. More specifically, the optimization system 200 may transform the initial mask into the mask derivative space by taking the derivative of the initial mask in block 405. Depending on the standard in which the initial mask is represented, various methods may exist and may be used for performing this task. If the initial mask is presented as a pixelated image, for example, the derivative of the mask can be implemented by the following finite difference formulas:

$$\frac{\partial}{\partial x}\{\cdot\}|_{(x_i,y_j)} = \Delta_x m(x_i, y_j) = m(x_{i+1}, y_j) - m(x_i, y_j)$$

$$\frac{\partial}{\partial y}\{\cdot\}|_{(x_i,y_j)} = \Delta_y m(x_i, y_j) = m(x_i, y_{j+1}) - m(x_i, y_j)$$

To ensure correctness of the finite difference method, the optimization system 200 may assume that the initial mask has a predefined buffer value outside its boundaries. If the mask is given in terms of vertices of a set of rectilinear polygons making up the initial mask, the derivative may be computed by starting from the vertex that is closest to one of the axes, setting the derivative at the respective coordinates to 1, and then alternately assigning −1 and 1 to each vertex position until arriving back at the starting vertex, one polygon at a time. The optimization system 200 may assign the derivative of the mask zero values elsewhere.

Eventually, when the method 400 of FIG. 4 is complete, the optimization system 200 may transform the output, at block 425. More specifically, the optimization system 200 may transform the resulting mask derivative to the desired mask, before outputting the desired mask, by performing a form of integration matching the targeted standard of the initial mask. Returning to the above example, the desired mask may be obtained as a pixelated mask, i.e., the same format as the initial mask, by performing a cumulative sum operation on the resulting mask derivative.

At block 410, after the input has been transformed in block 405, the optimization system 200 may compute an aerial image of the mask in the derivative space. The optimization system 200 may take advantage of the fact that the derivative of a mask is sparse, having only K (i.e., the number of vertices of the polygons in the mask) non-zero values. To obtain the value of a given point in the resulting pattern, the optimization system 200 may sum the value of K samples from the integral of the filter at specified positions, and weight them prior to the summing with a value in accordance to the derivative of the mask. The samples of the integral of the filter may be computed from a mathematical derivation, which may be obtained from a precomputed table stored in memory. In some embodiments, however, the weighting can be eliminated if different mathematical derivations are specified or if the tables used for the integral of the filter are already weighted with the corresponding values.

At block 415, the optimization system may compute an error between the printed pattern ($\bar{z}$) of the current mask and the desired pattern ($\bar{z}^*$). The optimization system 200 may employ the mean squared error as a metric to evaluate the difference between the printed pattern and the desired pattern. The mean squared error may be applied using electric field intensity, as in Abbe's model, or electric field energy intensity, as in the Hopkins Diffraction Model. The optimization system 200 may obtain the printed pattern by simulation from the derivative of the mask ($\bar{d}$). The aerial image formation may be accounted by the operator $\Psi$ and the resist etching by the operator $\Upsilon$:

$$F(\bar{d}) = |\bar{z}^* - z|_2^2 = |\bar{z}^* - \Upsilon\{\Psi\{\bar{d}\}\}|_2^2$$

The optimization system 200 may use electric field energy intensity, the result of the aerial image computation of block 410, and a sigmoid function for modeling the resist etching stage to determine the printed pattern. It will be understood, however, that other mechanisms for computing the error may also be possible and within the scope of this disclosure.

When a predefined termination condition is met, at decision block 420, a resulting mask derivative may be changed to the resulting mask, i.e., the desired mask, at block 425. This may be achieved by performing a form of integration matching the standard targeted. If the termination condition is not yet met, however, the optimization system 200 may proceed to block 430, which contains a set of operations (i.e., blocks 440-455) for computing update directions for the current mask. The lithography system 200 may perform an iterative loop, as will be described further below, until the termination condition is met.

This termination condition may be based on various considerations, such as the quantity of iterations performed, a threshold for the computed error, obtaining the minimum error, finding a local minimum (which is reflected by an oscillating behavior moving away and then back again to the same value), or a combination of these considerations. Other termination conditions may be used without departing from the spirit and scope of this disclosure.

The optimization system 200 may perform the overall mask optimization by iteratively making changes to the derivative of the mask until the printed pattern is considered close enough to the desired pattern when the error is computed. The optimization may be performed in attempt to minimize an objective function $F(\bar{d})$, the arguments of which may be the values of the derivatives on the following grid:

$$d^* = \underset{d}{\operatorname{argmin}} \sum_i \sum_j \left( x(x_i, y_j)^* - \frac{1}{1 + \exp\left(-\alpha\left(\sum_{\substack{(x_0, y_0) \\ \varepsilon \text{Rectangular grid}}} d(x_0, y_0)\hat{H}(x_y - x_i, y_i - y_j)\right)^2 + \alpha x_i\right)}\right)^2$$

Starting from the initial mask, the optimization system 200 may find, during each iteration, the changes in the mask derivative, referred to herein as "update directions," that move the current mask to the desired mask. The optimization system may compute the update directions, as in block 430.

At block 440, inside the iterative loop, the optimization system 200 may compute the gradient of the objective function. Having a differentiable function as the objective function, the optimization system 200 may use a convex optimization method based on the gradient of the objective function. Various known methods may be used to determine how the arguments of the objective function need to be changed to move the result to a minimizing or maximizing argument of the objective function. The gradient of the objective function is further referred to herein as $\nabla F$.

At bock 445, the optimization system 200 may compute a helper function used for computing the update directions for the mask. The information provided by the preceding block 440 may be used to compute a set of update directions that are compliant with the constraints of the mask derivative. Some embodiments of the optimization system 200 construct the helper function as a matrix given by:

$$G_{ij} = \nabla F_{ij} + \nabla F_{(i+1)(j+1)} - \nabla F_{i(j+1)} - \nabla F_{(i+1)j}$$

The variable $G_{ij}$ can be thought of as both a cross-correlation with the building blocks of the derivative image of the mask, as well as the directional derivative of the objective function. Other embodiments of helper function construction may also be used, as will be understood by one skilled in the art.

At block 450, the interior and exterior of the mask may be determined. In some embodiments, the constraints of the mask derivative may be linked to the pixel value of the mask, 0 or 1. The optimization system 200 may determine regions of the mask derivative that correspond to 0 or 1 regions of the mask.

At block 455, the optimization system 200 may select the update directions to be used, from among all possible update directions. To this end, the optimization system 200 may perform a parameter sweep, i.e., a line search. During the sweep, the optimization system 200 may select, from the proposed values of the parameter at each pass of the sweep, the proposed value that offers the solution deemed to be best.

It may be assumed that highly correlated regions of the gradient are regions for which the corresponding value in $G_{ij}$ is either at least 95% or 99% of the extreme values of $G_{ij}$. The term "highly correlated areas," as used herein, refers to a metric that indicates how close the values of the derivative are in similarity to a given pattern. The helper function can be viewed as the cross-correlation value of the gradient with a given pattern.

For each parameter value, the corresponding regions for which the value of $G_{ij}$ is negative and corresponds to an area of 0 in the mask may be changed in the derivative space to correspond to a pixel value of 1 in the mask. Analogously, for each parameter value, the corresponding regions for which the value of G is positive and corresponds to an area of 1 in the mask may be changed in the derivative space to correspond to a pixel value of 0 in the mask. As in the steepest descent technique, the positive and negative values of the gradient indicate that the arguments in the opposite direction should be changed to minimize the objective function. Knowledge of whether the corresponding region is a 0 or 1 may be needed to keep the constraints of the mask. Only pixel values of 0 and 1 need be allowed. It will be understood to one skilled in the art, however, that other techniques may be used to select the update directions from the possible update directions.

After computing the update directions, at block 460, the optimization system 200 may update the current mask based on those computed update directions. To this end, the optimization system 200 may use the properties of the one-to-one transform between the mask space and the mask derivative space. The operator τ in the derivative space may reflect changing one pixel from 1 to 0 or from 0 to 1 in the mask space, by adding the $$\begin{bmatrix} 1 & -1 \\ -1 & 1 \end{bmatrix}$$

matrix and the $$\begin{bmatrix} -1 & 1 \\ 1 & -1 \end{bmatrix}$$

matrix to the derivative of the mask at the corresponding positions. This operation may be sublinear, meaning that its application to various regions of the mask derivative is equivalent to applying an equivalent operator ξ that performs the task with fewer computations.

In some embodiments, the optimization system 200 may obtain the proposed mask changes by use of the operator τ, and may update the mask derivative by use of the operator ξ. The operator τ may allow flexibility in changing the mask and may assure convergence to the desired mask (i.e., the mask deemed optimal), while use of operator ξ may allow fast computation to be performed when combined with computation of the aerial image at block 470.

At block 465, the current mask may be reshaped. Embodiments of the optimization system 200 may deliver an optimal mask conforming to VLSI mask manufacturing constraints. At this block, the optimization system 200 may reshape the mask by eliminating parts of the current mask that do not correspond to the manufacturing capabilities, or by adding parts to the current mask to meet manufacturing capabilities. In some embodiments, block 465 need not be performed during every iteration, but may instead be performed once per every predefined number of iterations. Additionally, in some embodiments, part or all of this block 465 may be incorporated into the operations of block 430 during computation of the update directions.

At block 470, the optimization system 200 may once again compute the aerial image, as performed at block 410. At block 475, the optimization system 200 may once again compute the error, as performed at block 415. Afterward, the optimization system 200 may test for the termination condition, at block 420, to determine whether to perform another iteration or to transform the current mask derivative into a final resulting mask at block 425.

Figure 5A:
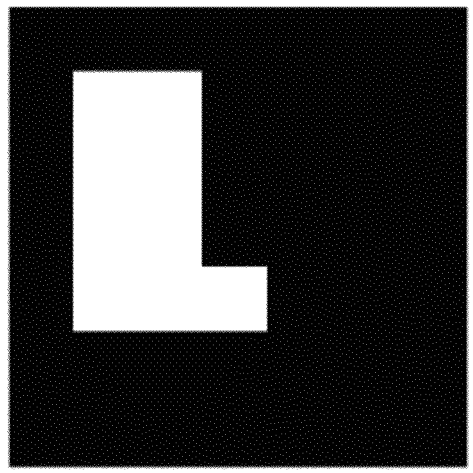
FIGS. 5A-5D illustrate example inputs and outputs of the optimization system, according to some embodiments of this disclosure.
Figure 5B:
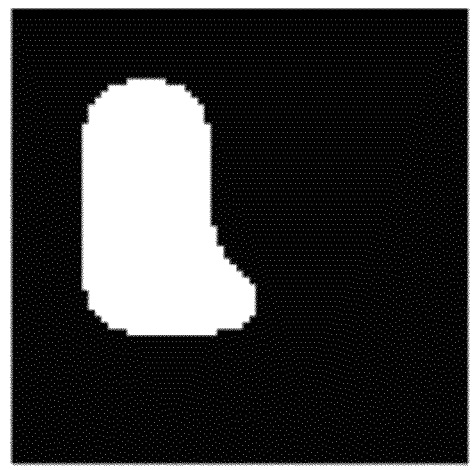
Figure 5C:
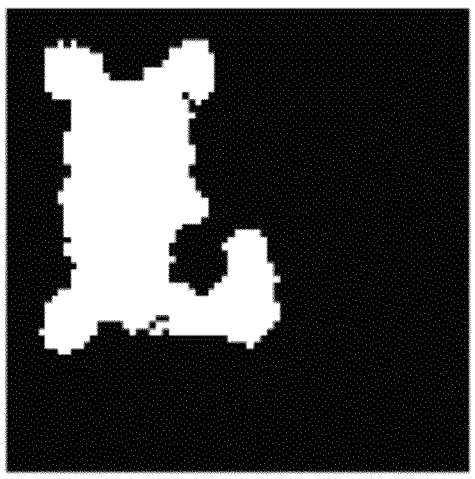
Figure 5D:
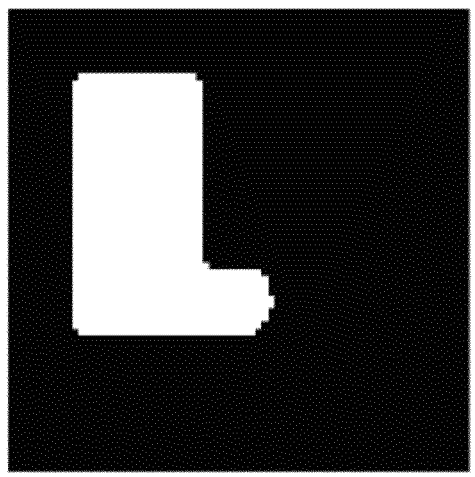

FIGS. 5A-5D illustrate example inputs and outputs of the optimization system 200, according to some embodiments of this disclosure. More specifically, FIG. 5A illustrates a desired pattern, sought to be produced through use of a mask. FIG. 5B is an example of a pattern that is likely to be provided by a traditional inverse lithography technique, when attempting to produce the pattern of FIG. 5A. FIG. 5C is an example output from some embodiments of the optimization system 200, when attempting to produce the pattern of FIG. 5A. FIG. 5D represents an example result that might be produced by a mask based on the pattern of FIG. 5C, which could be produced by a optimization system 200 according to some embodiments. As illustrated by FIG. 5D, as compared to FIG. 5B, embodiments of the optimization system 200 can produce improved results over traditional methods, which result may come closer to matching the desired pattern, illustrated in FIG. 5A.

Accordingly, various embodiments of the optimization system 200 and associated methods may be used to generate and output an optimal mask.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A computer-implemented method, comprising:
  accessing mask input data, comprising a mathematical representation of a mask in a mask representation space, wherein the mask is configured to create an integrated circuit microprocessor;
  transforming the mask input data into a derivative domain by calculating a derivative of the mask input data;
  obtaining a set of values based on the derivative of the mask input data;
  optimizing, by a computer processor, the set of values in the derivative domain of the mask input data to obtain optimized mask data; and transforming the optimized mask data into the mask representation space to obtain printable mask output data.

2. The method of claim 1, wherein the optimizing comprises iteratively computing a set of update directions for the mask and updating the mask according to the set of update directions, until a termination condition is met.

3. The method of claim 1, wherein the mask input data comprises a collection of polygons.

4. The method of claim 3, wherein the optimized mask data comprises a set of rectilinear polygons.

5. The method of claim 3, wherein obtaining the set of values based on a derivative comprises calculating the set of values at the vertices of the polygons.

6. The method of claim 1, wherein the optimizing comprises filtering based on a computed aerial image.

7. The method of claim 6, wherein the mask input data comprises a collection of polygons, further comprising computing the aerial image as a continuous aerial image from the collection of polygons, wherein the computing is performed absent sampling.

8. A system comprising:
- a data receiver configured to access mask input data, the mask input data comprising a mathematical representation of a mask in a mask representation space, wherein the mask is configured to create an integrated circuit microprocessor;
- a derivative unit configured to transform the mask input data into a derivative domain by calculating a derivative of the mask input data, and to obtain a set of values based on the derivative of the mask input data;
- an optimizing unit configured to optimize, by a computer processor, the set of values in the derivative domain of the mask input data to obtain optimized mask data; and
- a data output unit configured to transform the optimized mask data into the mask representation space to obtain printable mask output data.

9. The system of claim 8, wherein the optimizing unit is further configured to iteratively compute a set of update directions for the mask and to update the mask according to the set of update directions, until a termination condition is met.

10. The system of claim 8, wherein the mask input data comprises a collection of polygons.

11. The system of claim 10, wherein the optimized mask data comprises a set of rectilinear polygons.

12. The system of claim 10, wherein the derivative unit is further configured to obtain the set of values based on a derivative by calculating the set of values at the vertices of the polygons.

13. The system of claim 8, wherein the optimizing unit is further configured to filter based on a computed aerial image.

14. The system of claim 13, wherein the mask input data comprises a collection of polygons, and wherein the optimizing unit is further configured to compute the aerial image as a continuous aerial image from the collection of polygons, wherein the computing is performed absent sampling.

15. A computer program product comprising a non-transitory computer readable storage medium having computer readable program code embodied thereon, the computer readable program code executable by a processor to perform a method comprising:
- accessing mask input data, comprising a mathematical representation of a mask in a mask representation space, wherein the mask is configured to create an integrated circuit microprocessor;
- transforming the mask input data into a derivative domain by calculating a derivative of the mask input data;
- obtaining a set of values based on the derivative of the mask input data;
- optimizing the set of values in the derivative domain of the mask input data to obtain optimized mask data; and
- transforming the optimized mask data into the mask representation space to obtain printable mask output data.

16. The computer program product of claim 15, wherein the optimizing comprises iteratively computing a set of update directions for the mask and updating the mask according to the set of update directions, until a termination condition is met.

17. The computer program product of claim 15, wherein the mask input data comprises a collection of polygons, and wherein the optimized mask data comprises a set of rectilinear polygons.

18. The computer program product of claim 17, wherein obtaining the set of values based on a derivative comprises calculating the set of values at the vertices of the polygons.

19. The computer program product of claim 15, wherein the optimizing comprises filtering based on a computed aerial image.

20. The computer program product of claim 19, wherein the mask input data comprises a collection of polygons, further comprising computing the aerial image as a continuous aerial image from the collection of polygons, wherein the computing is performed absent sampling.

* * * * *